(12) United States Patent
McDonald et al.

(10) Patent No.: US 6,356,214 B1
(45) Date of Patent: Mar. 12, 2002

(54) FAST LOOK-UP TABLE BASED SCHEME FOR NRZI ENCODING/DECODING AND ZERO INSERTION/REMOVAL IN SERIAL BIT STREAMS

(75) Inventors: Rickie McDonald, Hollister; Sanjeev Ukhalkar, Fremont; Cai Monsson, Capitola, all of CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 09/241,715

(22) Filed: Feb. 2, 1999

(51) Int. Cl.⁷ .................................................. H03M 5/06
(52) U.S. Cl. ............................ 341/68; 341/106; 341/69
(58) Field of Search .............................. 341/68, 69, 59, 341/58, 63, 106

(56) References Cited

U.S. PATENT DOCUMENTS

| | | | | |
|---|---|---|---|---|
| 4,520,346 A | * | 5/1985 | Shimada | 341/68 |
| 5,021,894 A | * | 6/1991 | Naito et al. | 360/46 |
| 5,136,436 A | * | 8/1992 | Kahlman | 360/40 |
| 5,192,949 A | * | 3/1993 | Suzuki et al. | 341/68 |
| 5,699,061 A | * | 12/1997 | Shimpuku | 341/59 |

* cited by examiner

Primary Examiner—Peguy JeanPierre
(74) Attorney, Agent, or Firm—Blakely, Sokoloff, Taylor & Zafman LLP

(57) ABSTRACT

A look-up table scheme for performing non-return-to-zero inverted (NRZI) encoding on input data bytes. Also disclosed is a look-up table scheme for performing zero-insertion in data streams that so require. An address is formed from an input data byte and is then used to look-up the corresponding encoded/translated byte.

27 Claims, 6 Drawing Sheets

FAST LOOK-UP TABLE BASED SCHEME FOR NRZI ENCODING/DECODING AND ZERO INSERTION/REMOVAL IN SERIAL BIT STREAMS

FIELD OF THE INVENTION

The invention relates generally to data compression. More specifically, the invention relates to encoding/decoding data for use in communications systems.

BACKGROUND OF THE INVENTION

One design factor in communication systems is the scheme of encoding used to transmit data. One such scheme, popular in serial communication lines such as T1 is referred to as Non Return to Zero Inverted (NRZI) encoding. In NRZI, the last transmitted bit is fed back or stored to determine the outcome of the next bit encoded. FIG. 1 shows a traditional NRZI encoding engine 100 that encodes an input bitstream 105 into an output bitstream 110. The last transmitted bit is fed back into the encoding engine 100 to determine the next bit in output bitstream 110. The logic for determining the content of output bitstream 110 is as follows. If the current bit of input bitstream 105 is a zero, then the current output bit is the opposite of the last transmitted bit. If however the current input bit is one, then the output bit is the same as the last transmitted bit. For instance, consider the following input bitstream "0110010111010" (from left to right) and that the start is a low state or a zero. In this case the output bitstream would be "1110110000110". NRZI encoding is inherently serial in nature, since the last transmitted bit determines how the current input bit should be handled in order to encode that current input bit. Thus, for a unit of data such as an 8-bit byte to be NRZI encoded, it must be processed bit-by-bit in a serial fashion. This impacts the speed and efficiency of the communications system in handling data through its nodes. If bytes or other units of data could be encoded and decoded through NRZI but without resorting to serializing of the data and then re-assembly back into bytes, system efficiency can be increased.

Another technique called Zero Insertion is used to prevent a long string of ones a phenomenon known as flag sequence duplication. In SDLC (Synchronous Data Link Control), a flag sequence known as the "7E" flag separates frames of data. The binary equivalent of the 7E flag would be 01111110, and thus has a string of 6 consecutive ones. If such a string occurs in the data stream itself (between real 7E flags), the decoding may confuse it for a flag indicating the start of another frame. To avoid this confusion, whenever a series of five 1s is encountered, a zero is inserted into the data stream. As with the NRZI encoding process, this too is inherently serial, in that the number of consecutive ones must be counted as they occur in the data stream. When decoded, these zeroes are removed, also in the same serial manner. As a result, even if NRZI itself were not serial, zero insertion and removal would still remain a strictly serial operation, once again adversely impacting the speed of the communications system.

SUMMARY OF THE INVENTION

What is disclosed is a method comprising forming an address for non-return-to zero inverted (NRZI) encoding of a current input data byte, and accessing in a look-up table an NRZI output value pointed to by the address, the NRZI output value the equivalent of having performed NRZI encoding upon the current input data byte.

BRIEF DESCRIPTION OF THE DRAWINGS

The objects, features and advantages of the method and apparatus for the present invention will be apparent from following description, wherein like references indicate similar elements, in which.

DETAILED DESCRIPTION

What is disclosed is a look-up table scheme for performing non-return-to-zero inverted (NRZI) encoding on input data bytes. Also disclosed is a look-up table scheme for performing zero-insertion in data streams that so require. An address is formed from an input data byte and is then used to look-up the corresponding encoded/translated byte. Look-up tables may also be employed where NRZI encoded is decoded and where zero-inserted data is zero-removed.

Figure 1:
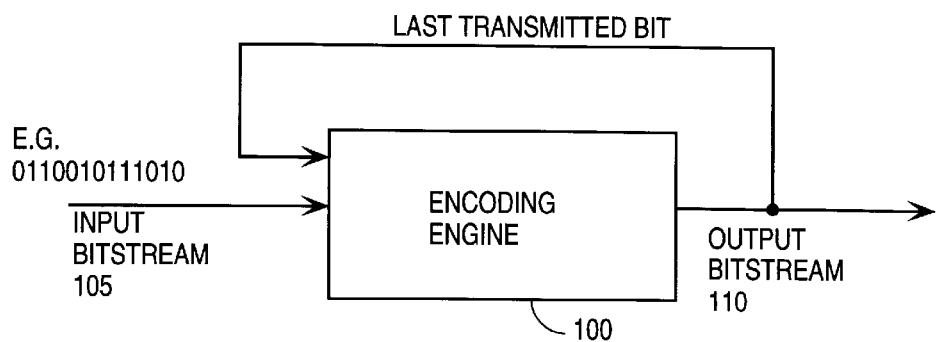
FIG. 1 illustrates traditional NRZI encoding.
Figure 2:
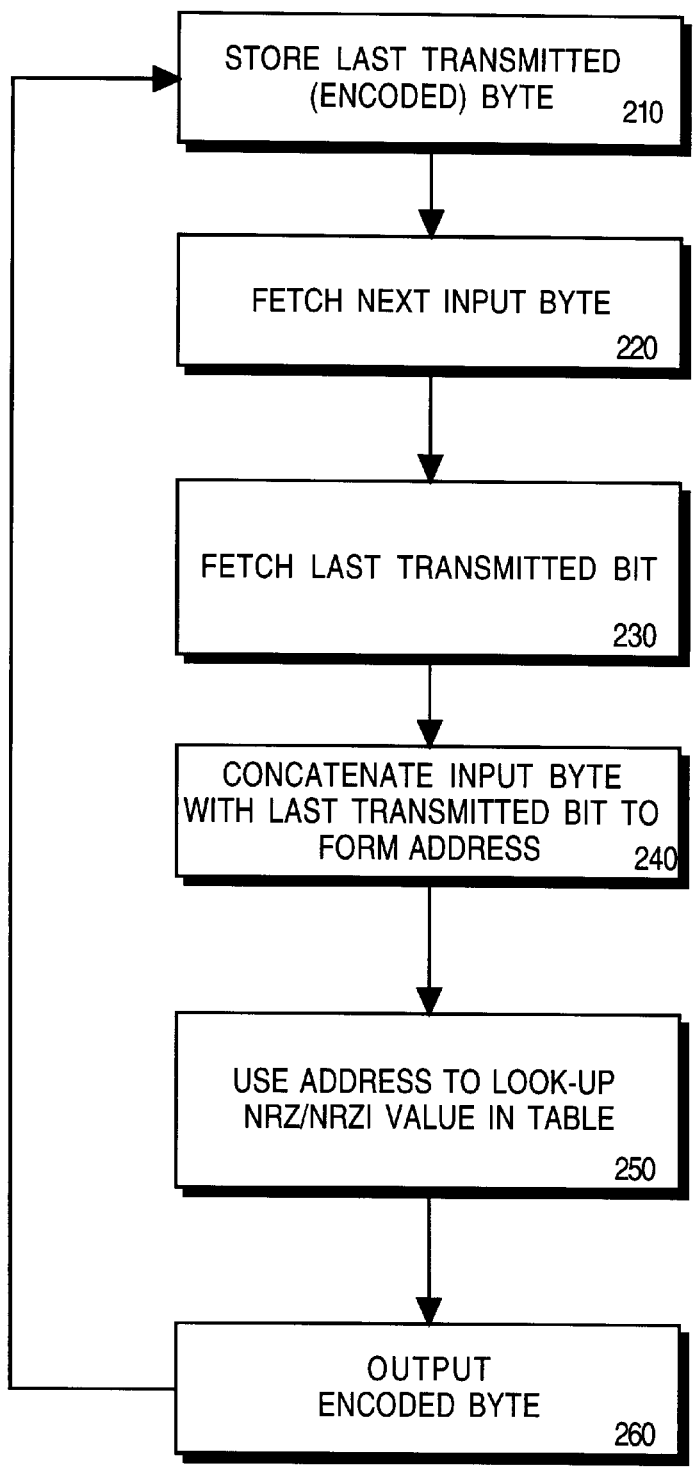
FIG. 2 is a flow chart of look-up table based NRZI encoding.

FIG. 2 is a flow chart of look-up table based NRZI encoding.

Assuming a previous byte has been encoded and transmitted, this encoded byte should be stored in a holding register so that it can be analyzed to determine how to encode the next byte (block 210). Then, the next input byte can be fetched (block 220). Depending upon the line speed of the system, the input "byte" may have 6, 7 or 8 bit of data, and in this sense, the word "byte" refers to any discrete unit of data having more than one bit. Since NRZI depends upon the status of the last transmitted bit, this bit is fetched from the holding register that stores the last transmitted (encoded) byte (block 230). Next the last transmitted bit is concatenated with the fetched input byte to be encoded to form a look-up address (block 240). This look-up address will vary depending upon the size of the byte (the data line speed) but will always be one bit greater than that size. Thus, an 8-bit byte would have a corresponding 9-bit address. This address is used to look-up an NRZ/NRZI encoded equivalent value in a look-up table that may be precompiled with all such possible values (block 250). The result of the table look-up will be a byte (with a size one less than the address) that is in NRZ/NRZI form. This encoded byte is then output (block 260) to be transmitted and is also stored for access in forming the next look-up address (block 210).

The use of a look-up table for NRZI encoding allows data to be processed in a byte-by-byte manner rather than in bit serial fashion as with traditional NRZI. A look-up can be pre-compiled and loaded into the device which needs to do the encoding, along with an addressing mechanism (shown in FIG. 3). A look-up table may be compiled by incrementing through each of the possible 9-bit addresses and computing an NRZI value for each combination. It may also be possible to reduce the number of entries in the table by factors of 2 if certain patterns or duplication is readily discoverable and easily taken advantage of in terms of addressing mechanisms. One intended advantage is that speed of the system is increased and the cost of encoding circuitry is avoided.

Figure 3:
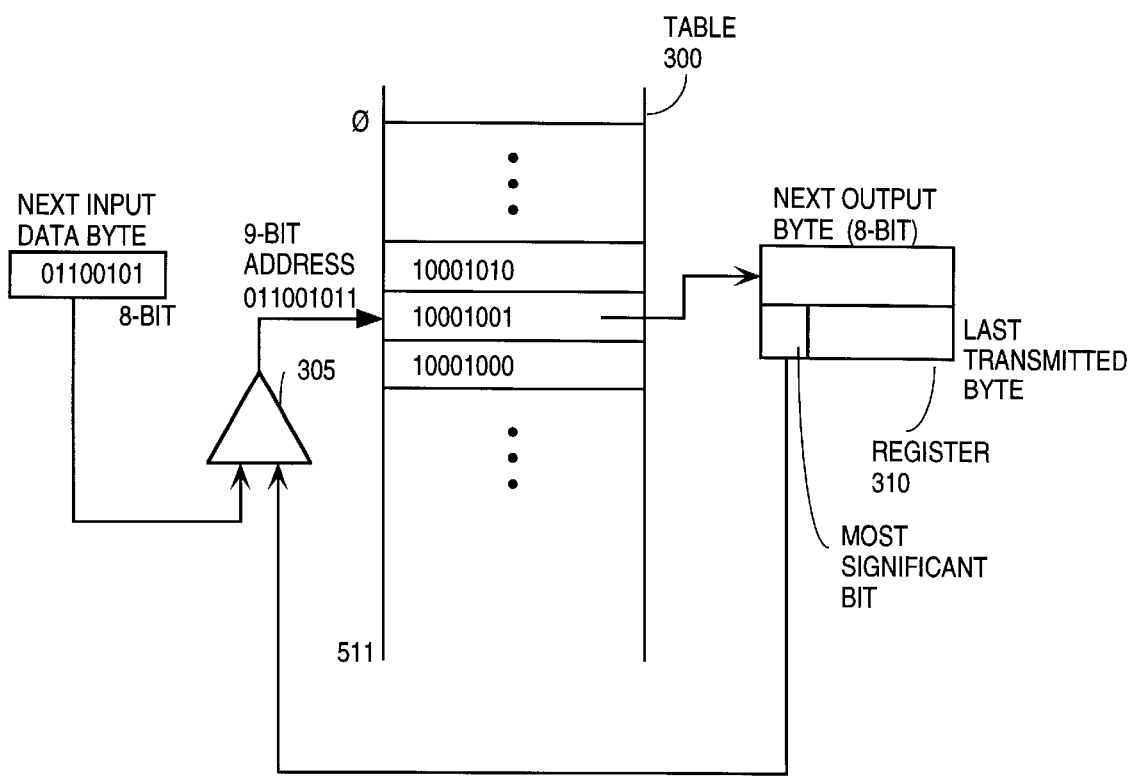
FIG. 3 is a circuit diagram of look-up table based NRZI encoding.

FIG. 3 is a circuit diagram of look-up table based NRZI encoding.

FIG. 3 shows a look-up table 300 that has 512 ($2^9$) entries of 8-bit NRZI encoded values in each entry. The look-up table is precompiled with a sequential array of values that would result from an 8-bit input byte when combined with a previously transmitted bit. Each 8-bit input data byte is fed into a parallel loaded register 305 along with the most significant bit of the last transmitted byte stored in a register 310. The most significant bit of the last transmitted byte is the last transmitted bit which is used under the rules of NRZI to determine what the next transmitted bit should be. If the current input bit is a one, then the transmitted (encoded) equivalent is the same as the last transmitted bit. If the current input bit is a zero, then the transmitted (encoded) equivalent is the inverse of the last transmitted bit. Given such rules, the last transmitted bit must be fed back into the system and in this, embodiment, is used as part of the look-up address. The 9-bit address points to one of 512 entries in table 300 which may be read out as the next output byte (transmitted byte) and stored into a part of register 310 for transmission. This output byte is shifted down to a second portion of the register 310 so that it can be fed back for forming the address for the next output byte. By reading the whole 8-bit output byte for each address (input byte plus last transmitted bit), data can be processed byte-by-byte rather than in the serial bit-by-bit fashion.

An example is illustrated in FIG. 3 where an input byte "01100101" is to be encoded into NRZI. Assuming that the most significant bit of the last transmitted byte (last transmitted bit) is a 1, then element 305 will form a 9-bit address "011001011". This address would point to the encoded entry "10001001". Following the NRZI algorithm, take the first bit of the 8-bit input byte (reading right to left) which is a 1. According to NRZI rules, since the input bit is a 1, the current output would be the same as the last transmitted bit or 1. The current output then becomes the last transmitted bit, and the process would continue in a right to left order. However, since the look-up table is pre-compiled, such a bit computation need only be performed once when the table is being compiled and can be eliminated during the operation of the communications device in which it is employed.

The table 300 shows three consecutive output byte entries—"10001010", "10001001" and "10001000" which would correspond to input addresses "011001010", "011001011" and "011001100" respectively. Thus, the table can be sequentially addressed. The compilation of the table would follow the NRZI rules with an incrementing counter which provides the input byte combinations starting with address "000000000" and ending with address "111111111". In an alternative embodiment, a table for 8-bit input and output bytes using NRZI may be constructed having only $2^8$ or 256 entries since the possible output bytes are duplicated in exact measure in the 512 entry table shown in FIG. 3. For instance, the address "111001100" would have an encoded output byte equivalent of "11110111" as would the address "111001111". Thus, the table could be reduced such that if the last bit transmitted was a one, then invert least significant bit of input byte. For implementations where memory is at a premium, this would have the intended advantage of using only half as much memory.

As discussed above, a NRZI decoding table may be similarly compiled and implemented. Such a decoding table would have NRZI data as addresses to look up decoded values, and is thus the opposite of the encoding scheme.

Figure 4:
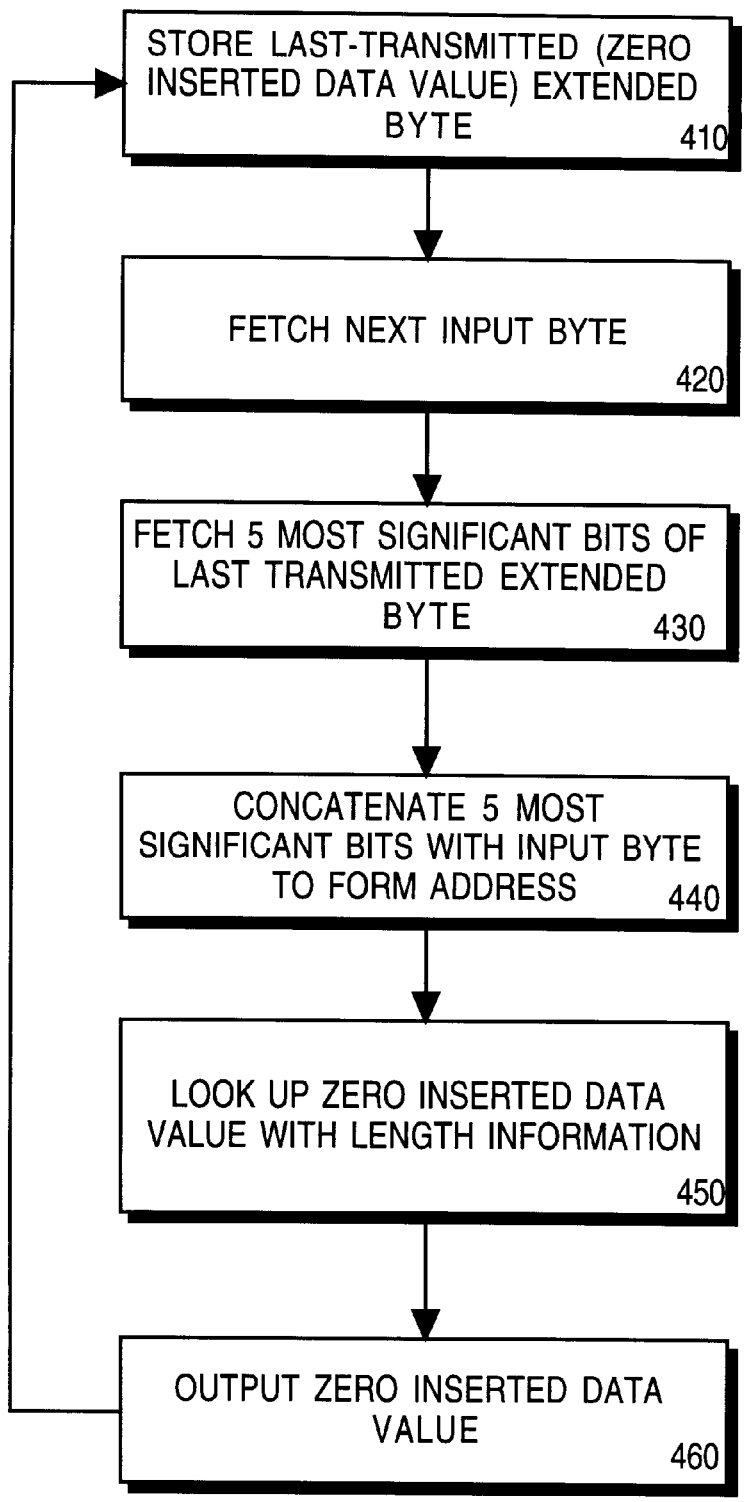
FIG. 4 is a flow diagram of look-up table based zero-insertion.

FIG. 4 is a flow diagram of look-up table based zero insertion.

Zero insertion is a means of assuring that certain reserved sequences containing many 1s such as flags are not accidentally included in encoded data such that upon decode a race condition would arise as to whether the decoded stream is data or flag. For instance, in the case of the "7E" flag (binary equivalent "01111110" has a string of six consecutive 1s. In order to prevent this flag sequence from being duplicated in the data stream, encoded data should have a zero inserted whenever a sequence of five 1s are encountered. Since there may be sequence of such 1s which start in one byte and continue in another byte, five bits of the previously transmitted byte must be examined in order to determine where and when to insert zeroes. Typically, serial methods for zero insertion are readily implementable, but slow down the processing of data, requiring all bytes to stripped down and serially analyzed. Further, in hardware, a counter must be maintained to detect the presence of five consecutive is which must be incremented and if five is do not occur, reset, thus wasting power, space, and sacrificing system throughput ability. As an alternative to the hardware circuitry approach, a look-up table technique is described below as one embodiment of the invention.

First, the technique assumes that prior to processing each input byte, the last transmitted extended byte, which is a zero-insertion processed data value, is stored for examination (block 410). If so, the next input byte, the byte whose data is to be zero-insertion processed, may be fetched (block 420). As discussed above, in the hardware approach, the last five bits that were transmitted must be examined in order to guarantee that zeroes are inserted where need be. In a different manner, the table look-up approach presented here uses these bits as part of the table address. The five most significant bits of the last transmitted byte are fetched for this purpose (block 430). To form a table look-up address the five most significant bits are concatenated together with the fetched input data byte. If the input data byte is eight bits then the address formed will be thirteen bits wide. The output data byte which is zero-insertion processed is of indefinite length and may be either 8, 9 or 10 bits if the input data byte is 8 bits long. For an 8-bit input data byte, the output data value would be 8 bits as is the input byte if no zeroes need to be inserted, 9 bits if one zero is inserted and 10 bits if two zeroes are inserted. The latter scenario is possible if the last transmitted five bits is all 1s and if any five consecutive bits (reading right to left) in the input data byte are also 1s.

Thus, utilizing the thirteen bit address, an output extended data value which is zero-inserted of either 8, 9 or 10 bits is looked up along with information regarding the length of the zero-inserted value (block 450). The zero-inserted extended data value is then output to be transmitted (block 460). In case of a 9-bit or 10-bit zero-inserted extended values, the extra one or two bits would need to be packed into the succeeding 8-bit output byte for the purposes of line transmission in some design instances.

Unlike the look-up table for NRZI encoding, the look-up table for zero-insertion may also need to maintain an entry storing the length information for each zero inserted value. The length information would inform the system how many bits of data in the table entry are valid for read-out, since the table would probably be constructed with uniform entry word sizes (of the maximum ten bits). Such information would also alert the data transmission/packing mechanism to perhaps expect more than 8 bits. The look-up table can be pre-compiled by executing instructions which count all possible 13-bit addresses (in the case of 8-bit input bytes) and create zero-inserted values by inserting zeroes where necessary in the most significant 8 bits (representing possible input data bytes). Once compiled, the look-up table may be used repeatedly whenever zero insertion service is needed in a particular node or device. In systems where memory is readily available or more cost-effective, intended advantages are that system speed can be increased and perhaps system cost decreased even given the need to stored $2^{13}$ data values and length information.

Though not illustrated, zero removal could be implemented by automatically discarding or disregarding the bit following five 1s in the encoded data. Such a scheme may take the form of a zero-removal look-up table where certain sequences of data that have five ones are mapped to zero-removal corresponding output bytes.

Figure 5:
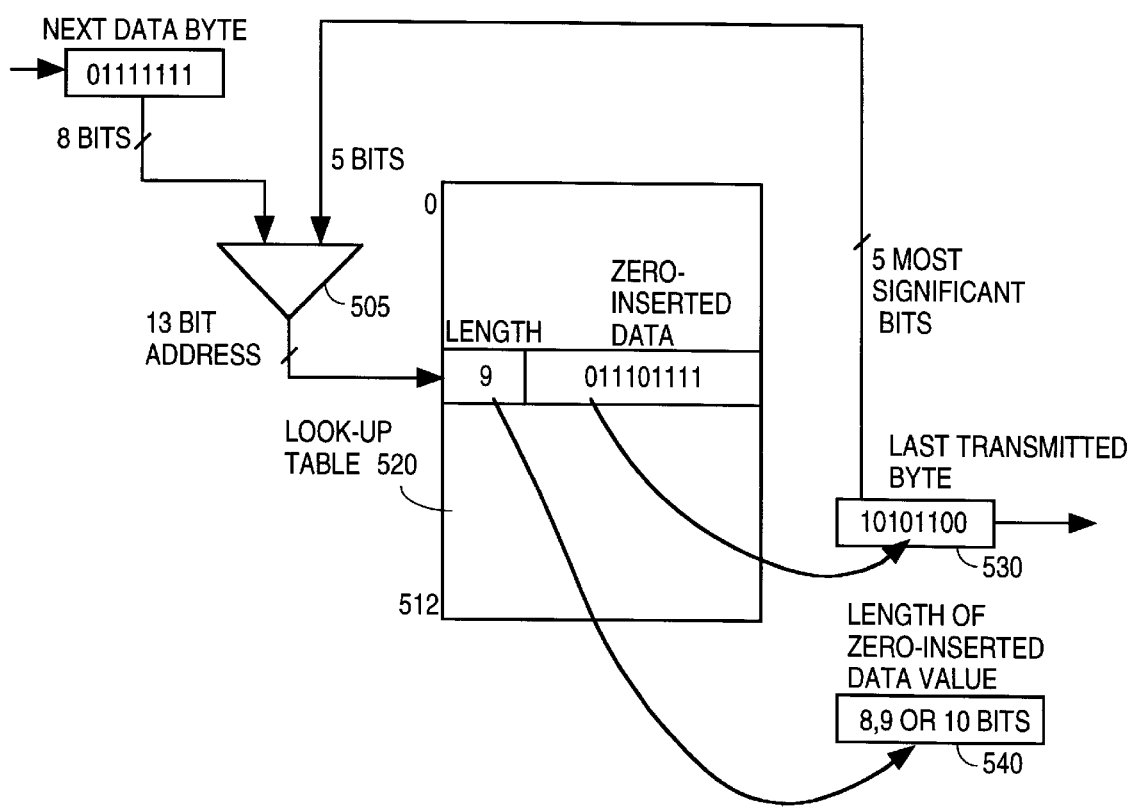
FIG. 5 is a circuit diagram of look-up table based zero insertion.

FIG. 5 is a circuit diagram of look-up table based zero insertion.

FIG. 5 shows a look-up table 520 that has $2^{13}$ or 8192 zero-inserted data value entries and for each, a corresponding length value. The last transmitted byte is stored in a register 530 such that it can be examined in determining the address to look-up the next output data value. Since the length of the extended data values are variable, the length information is also held in a register 540 for purposes of data packing.

The five most significant bits of the last transmitted byte stored in register 530 are concatenated together by an element 505 with the eight bits comprising the next input data byte to form a thirteen bit address. This address is passed to look-up table 520 in which it would point first to a length indicator for the extended data value entry corresponding to that address. The length information indicates how many bits of the entry are to be read out (8, 9 or 10) for transmission. If the table were built the zero-inserted data value field having a uniform 10 bit width regardless of the actual size (8, 9 or 10) of the zero-inserted value to be stored therein, then it may not be possible to tell if the bits 9 and 10 in any given entry are valid or invalid.

The example shown in FIG. 5 involves the zero-insertion for an input data byte having the value "01111111". if the last transmitted byte were "10101100", then the five most significant bits for the purpose of address computation would be "10101". When combined with the input data byte, the address becomes "0111111110101". This address indicates that eight consecutive 1s occur when both the input data byte and last transmitted byte (in relevant portion) are considered together as a single stream. Reading from right to left (the direction of streaming in and out) a zero should be inserted in the stream as underlined: "011101111110101". If the five least significant bits are stripped off, this leaves a zero-inserted data value of "11101111" which has a length of nine bits rather than eight bits. Thus, the entry in the table corresponding to an address of "0111111110101" would first point to the length field, indicating nine bits are in the data field. Then, the mechanism would read the nine bits of the zero-inserted data value field which would be "011101111". This zero-inserted extended value of nine bits would be output and stored in register 530. Further, the value of the length field, 9, would read out to register 540. In an alternative embodiment, rather than using five bits of the last transmitted byte, a count of the number of consecutive ones in the most significant bits could be concatenated with the input byte to form an address. The count value would at most be 5, and thus have 3 bits. Thus, the look-up table would have ¼ the number of entries (2") of the one described above, and an 11-bit addressing scheme.

The table which is pre-compiled with all the possible patterns allows zero-inserted data values to be read out in their entirety and allows the input data to be processed byte-by-byte rather than bit-by-bit, thus improving speed and throughput. Likewise, zero-removal tables may be compiled and employed that use zero-inserted addresses to look up 8-bit output bytes.

Figure 6:
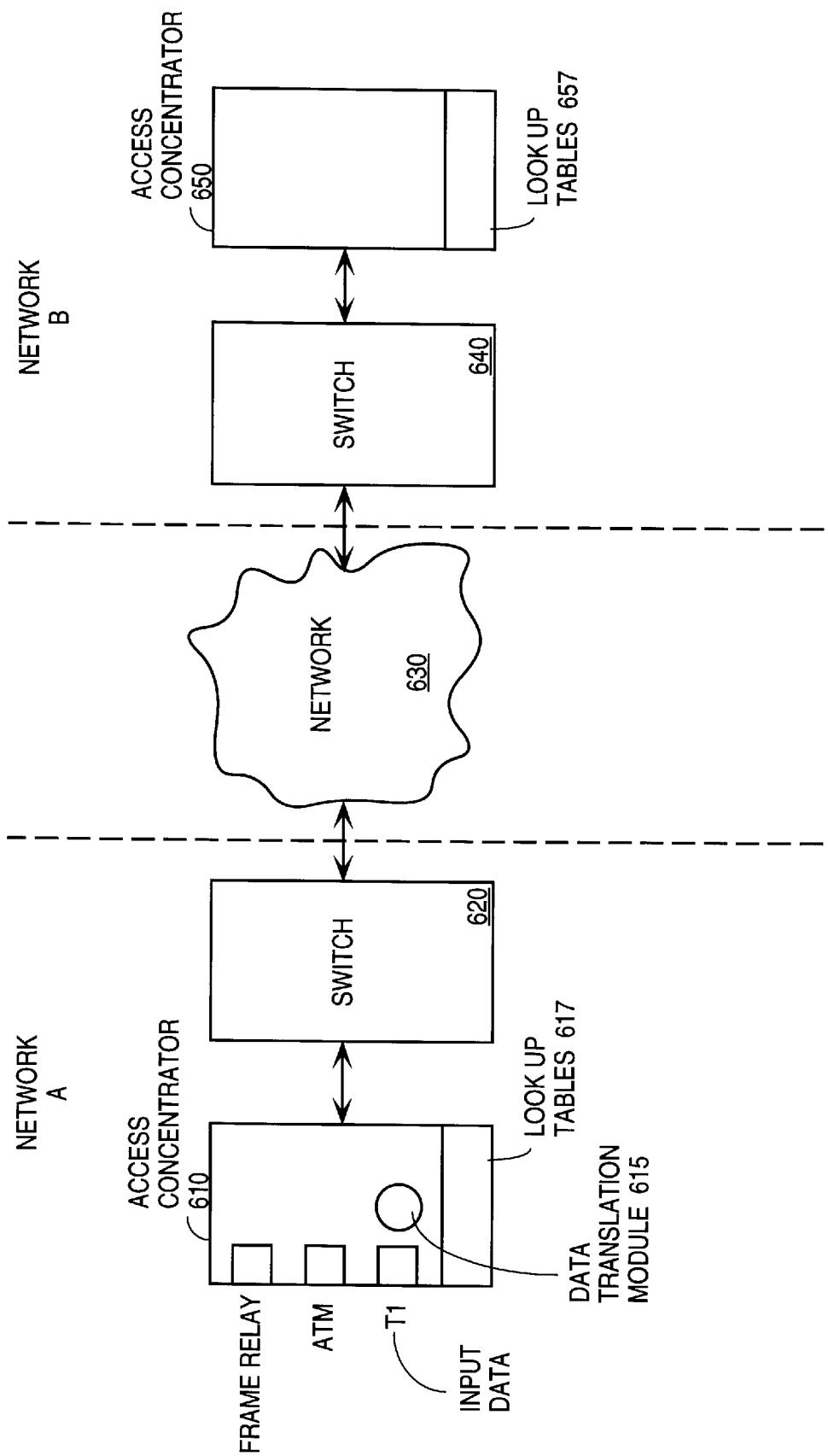
FIG. 6 is a diagram of a system using look-up table based NRZI and zero-insertion.

FIG. 6 is a diagram of a system using look-up table based NRZI and zero-insertion.

FIG. 6 shows a communications network 630 which can connect together a plurality of other networks/devices to facilitate information transfer. In the example of FIG. 6 two networks A and B have entry points designated as switches 620 and 640, respectively. Switch 620 in this example is connected to an access concentrator 610 which facilitates the utilization of different data access services such as frame relay, ATM (Asynchronous Transfer Mode) and serial line transfer mechanisms such as T1. Likewise, in network B, switch 640 is connected to an access concentrator 650 which provides functionality (not shown) similar to that of access concentrator 610.

In one possible configuration, switch 620 and/or switch 640 may operate as ATM switching devices bridging an ATM network 630. If a T1 access line, which provides serial data transmission in various "line speeds" (6, 7 or 8 bit bytes) is to send data through such an ATM network, then the input data must be translated (at the data link level) in order to be acceptable to switch 620 for further forwarding. A data translation module 615, which may be hardware, software, firmware or a combination thereof, would convert the SNA formatted data input from the T1 into a frame that can be recognized by an ATM network. Access concentrators such as access concentrator 610 are typically modular hardware connecting devices into which adapters and controller chips are plugged in for a particular type of network access such as T1. In typical access concentrators, data encoding and decoding are performed by specialized circuitry designed within such controller chips and adapters.

According to one embodiment of the invention, such encoding and decoding is built into the access concentrator by means of look-up tables eliminating the need for such circuitry. Rather than customize the adapters and controller chips to work with the data specifications of the access concentrator and of the network into which it will be inserted, these add-in devices are relieved of this duty by use of the look-up tables, allowing for more inexpensive connections. As shown in FIG. 6, access concentrator 610 is loaded with one or more look-up tables 617 which can provide translated data values that are pre-compiled for operations such as NRZI and zero-insertion. Further, if separate tables are needed for 6, 7 or 8 bit bytes, such tables can pre-compiled and stored side-by-side. These tables may be combined into a single table, particularly, the NRZI and zero-insertion for a given input data size such as the 8-bit examples described above. When input data is to be frame converted for network transport, data translation module 615 can be configured with the addressing mechanisms necessary to look-up corresponding NRZI and/or zero-inserted values in tables 617. Likewise, look-up tables may be provided for other forms of access as needed or desired. Though the examples of FIGS. 3 and 5 show 8-bit input data byte processing, the look-up tables may be pre-compiled to handle any size chunk of input data, and while increasing exponentially the number of needed look-up table entries in so doing, may still provide cost and efficiency advantages.

Since data may flow to and from access concentrator 610, look-up tables 617 could have not only encoding and zero-insertion tables but decoding and zero-removal tables as well. Access concentrator 650 may also contain look-up tables 657 similar to look-up tables 617 to facilitate the translation of data. By use of look-up tables, serial operations such as encoding/decoding and zero insertion/removal are transformed into chunk-by-chunk (byte-by-byte) operations. Further, look-up tables if provided within the access devices themselves will have the intended advantage of allowing modular components to be less specifically designed and perhaps, more inexpensively built. This allows the access devices to in effect accept more generic adapters and services. Whenever new previously unanticipated network services need to be accommodated, more look-up tables may be compiled and loaded into the access device along with any needed data translation modules for addressing.

What is claimed is:

1. A method of performing non-return-to-zero inverted encoding, comprising:
    forming an address for a look up table comprising a plurality of non-return-to zero inverted (NRZI) encoded data corresponding to a plurality of input data respectively, wherein said address is formed using a current input data and a most significant bit (MSB) of a previous NRZI encoded data accessed from the look-up table; and
    accessing in said look-up table an NRZI encoded data pointed to by said address, said NRZI encoded data corresponds to said current input data.

2. The method according to claim 1 further comprising:
    pre-compiling said look-up table to store said plurality of NRZI encoded data using valid addresses for said look-up table, wherein said plurality of NRZI encoded data is generated by performing NRZI encoding upon said valid addresses.

3. The method according to claim 1 wherein forming an address comprises:
    concatenating said most significant bit with said current input data to form said address.

4. The method according to claim 3 wherein a length of said address is one bit longer than a length of said current input data.

5. The method according to claim 1, wherein a length of said current input data is equal to a length of said corresponding NRZI encoded data from said look-up table.

6. A method comprising:
    forming an address for a look-up table comprising of a plurality of zero insertion encoded data corresponding to a plurality of input data respectively, wherein said address is formed using a current input data and five most significant bits of a previous zero-insertion encoded data accessed from said look-up table; and
    accessing in said look-up table a zero-insertion encoded data pointed to by said address, said zero-insertion encoded data corresponds to said current input data.

7. The method according to claim 6 further comprising:
    pre-compiling said look-up table to store said plurality of zero insertion encoded data using valid addresses for said look-up table, wherein said plurality of zero insertion encoded data is generated by performing zero-insertion processing upon said valid addresses.

8. The method according to claim 6 wherein forming an address comprises:
    concatenating said five most significant bits with said current input data to form said address.

9. The method according to claim 8 wherein a length of said address is five bits longer than a length of said current input data.

10. The method according to claim 8, wherein said five most significant bits are concatenated to least significant bit positions of said current input data to form said address.

11. The method according to claim 6 wherein accessing includes:
    retrieving a length value of said zero-insertion encoded data from said look-up table at said address; and
    reading out said zero-insertion encoded data from said look-up table, wherein a number of bits in said zero-insertion encoded data is determined by said length value.

12. The method according to claim 11, wherein the length value is determined based on a number of zeroes inserted into said address, wherein a bit 0 is inserted each time five consecutive 1s is encountered, the five consecutive 1s is counted from the least significant bit position, and wherein the length value is equal to a number of bits remaining after the five bits in the least significant bit positions is truncated.

13. A computer readable medium having stored thereon sequences of instructions which are executable by a digital processing system, and which, when executed by the digital processing system, cause the system to perform a method comprising:
    forming an address for a look up table comprising a plurality of non-return-to zero inverted (NRZI) encoded data corresponding to a plurality of input data respectively, wherein said address is formed using a current input data and a most significant bit (MSB) of a previous NRZI encoded data accessed from the look-up table; and
    accessing in said look-up table an NRZI encoded data pointed to by said address, said NRZI encoded data corresponds to said current input data.

14. The computer readable medium according to claim 13 further comprising:
    pre-compiling said look-up table to store said plurality of NRZI encoded data using valid addresses for said look-up table, wherein said plurality of NRZI encoded data is generated by performing NRZI encoding upon said valid addresses.

15. The computer readable medium according to claim 13 wherein forming an address comprises:
    fetching a most significant bit of a previous NRZI encoded data accessed from the look-up table; and
    concatenating said most significant bit with said current input data to form said address.

16. The computer readable medium according to claim 15 wherein a length of said address is one bit longer than a length of said current input data.

17. The computer readable medium according to claim 13, wherein a length of said current input data is equal to a length of said corresponding NRZI encoded data from said look-up table.

18. A computer readable medium having stored thereon sequences of instructions which are executable by a digital processing system, and which, when executed by the digital processing system, cause the system to perform a method comprising:
    forming an address for a look-up table comprising of a plurality of zero insertion encoded data corresponding to a plurality of input data respectively, wherein said address is formed using a current input data and most significant bits of a previous zero-insertion encoded data accessed from said look-up table; and
    accessing in said look-up table a zero-insertion encoded data pointed to by said address, said zero-insertion encoded data corresponds to said current input data.

19. The computer readable medium according to claim 18 further comprising:

pre-compiling said look-up table to store said plurality of zero insertion encoded data using valid addresses for said look-up table, wherein said plurality of zero insertion encoded data is generated by performing zero-insertion processing upon said valid addresses.

20. The computer readable medium according to claim 18 wherein forming an address comprises:

concatenating said five most significant bits with said current input data to form said address.

21. The computer readable medium according to claim 20 wherein a length of said address is five bits longer than a length of said current input data.

22. The computer readable medium according to claim 18 wherein accessing includes:

retrieving a length value of said zero-insertion encoded data from said look-up table at said address; and reading out said zero-insertion encoded data from said look-up table, wherein a number of bits in said zero-insertion encoded data is determined by said length value.

23. A system, comprising:

a memory configured to store a plurality of zero insertion encoded data; and a first logic configured to present an address to said memory to retrieve a first zero insertion encoded data, the address formed using an input data and five most significant bits of a second zero insertion encoded data previously retrieved from said memory, wherein said five most significant bits are concatenated to said input data at least significant bit positions to form said address, and wherein said first zero insertion encoded data is equivalent to a result of performing zero insertion encoding on said input data to prevent misidentifying said input data as a reserved flag.

24. The system of claim 23, wherein the reserved flag is 111111 in binary representation.

25. The system of claim 23, wherein said memory is further configured to store a length value to indicate length of each zero insertion encoded data.

26. A method, comprising:

forming an address for a look up table comprising a plurality of non-return-to zero inverted (NRZI) encoded data corresponding to a plurality of input data respectively, wherein said address is formed using a current input data and a most significant bit (MSB) of a previous NRZI encoded data accessed from the look-up table, the MSB concatenated with said current input data to form said address, said look-up table precompiled to store said plurality of NRZI encoded data using valid addresses for said look-up table, said plurality of NRZI encoded data is generated by performing NRZI encoding upon said valid addresses; and accessing in said look-up table an NRZI encoded data pointed to by said address, said NRZI encoded data corresponds to said current input data.

27. A system, comprising:

a memory configured to store a plurality of non-return-to zero inverted (NRZI) encoded data; and a first logic configured to present an address to said memory to retrieve an NRZI encoded data, the address formed using an input data and a most significant bit of a previous NRZI encoded data retrieved from said memory, wherein said most significant bit is concatenated to said input data at a least significant bit position to form said address, and wherein said NRZI encoded data is equivalent to a result of performing NRZI encoding on said input data.

* * * * *

UNITED STATES PATENT AND TRADEMARK OFFICE
CERTIFICATE OF CORRECTION

PATENT NO. : 6,356,214 B1
DATED : February 15, 2005
INVENTOR(S) : Chun-Yun Jian et al.

It is certified that error appears in the above-identified patent and that said Letters Patent is hereby corrected as shown below:

Column 10,
Line 20, the word "...chance..." should read -- ...change... --

Signed and Sealed this

Thirty-first Day of May, 2005

JON W. DUDAS
*Director of the United States Patent and Trademark Office*